United States Patent [19]

Mihashi et al.

[11] 4,210,466
[45] Jul. 1, 1980

[54] PROCESS FOR PREPARING HEAT SENSITIVE SEMICONDUCTOR SWITCH

[75] Inventors: Yutaka Mihashi; Josuke Nakata, both of Itami, Japan

[73] Assignee: Mitsubishi Denki Kabushiki Kaisha, Tokyo, Japan

[21] Appl. No.: 966,627

[22] Filed: Dec. 5, 1978

[30] Foreign Application Priority Data

Dec. 5, 1977 [JP] Japan ................... 52-146245

[51] Int. Cl.$^2$ ............... H01L 23/56; H01L 29/66; H01L 21/263
[52] U.S. Cl. ................... 148/1.5; 357/28; 357/38; 357/91
[58] Field of Search .............. 148/1.5; 357/28, 38, 357/39, 91

[56] References Cited

U.S. PATENT DOCUMENTS

| | | | |
|---|---|---|---|
| 3,971,056 | 7/1976 | Jaskolski et al. | 357/28 |
| 4,047,976 | 9/1977 | Bledsoe et al. | 148/1.5 |
| 4,081,818 | 3/1978 | Nakata | 357/28 |
| 4,112,458 | 9/1978 | Jaskolski et al. | 357/38 |
| 4,117,505 | 9/1978 | Nakata | 357/28 |
| 4,134,778 | 1/1979 | Sheng et al. | 148/1.5 |

FOREIGN PATENT DOCUMENTS 50-146283  11/1975  Japan .

Primary Examiner—R. Dean
Assistant Examiner—Roy Upendra
Attorney, Agent, or Firm—Oblon, Fisher, Spivak, McClelland & Maier

[57] ABSTRACT

A process for preparing heat sensitive semiconductor switch which switches from OFF state to ON state at relatively low temperature.

In a heat sensitive thyristor having PNPN four layer structure, an N type base region is exposed at one part of the surface exposed part in the P type base region to form an opening and ions of a P type impurity such as boron, aluminum and gallium are implanted from the opening to form a part having a large leakage current in a collector junction under excellent control, and to provide lower switching temperature for switching from the OFF state to the ON state with high reproducibility.

3 Claims, 4 Drawing Figures

(a)

(b)

PROCESS FOR PREPARING HEAT SENSITIVE SEMICONDUCTOR SWITCH

BACKGROUND OF THE INVENTION

1. Field of the Invention

The present invention relates to a process for preparing a heat sensitive semiconductor switch which has high reproducibility to give a suitable switching temperature for switching from the OFF state to the ON state.

2. Description of The Prior Art

The semiconductor switch of the present invention has at least three PN junctions and has two stable states consisting of an OFF state and an ON state in the voltage-current characteristics between main electrodes which is usually called as a thyristor.

In the conventional thyristors, a rated maximum junction temperature is chosen to allow the use of thyristors only in a temperature range such that an OFF voltage is not decreased by increasing the junction temperature to prevent a turn on by a thermal change. The temperature for eliminating the OFF voltage by elevating the temperature is significantly higher than the rated maxmimum junction temperature. There is no conventional thyristor which switches from the OFF state to the ON state by a thermal change at relatively low temperature such as room temperature to 100° C.

In order to obtain a semiconductor switch for switching from the OFF state to the ON state at relatively low temperature, it is necessary to increase a leakage current at the PN junction of the thyristor which is reversely biased in OFF state.

As the manner for increasing a leakage current, a region having many recombination centers is formed in a space charge layer of the reverse-biased PN junction. This is disclosed in Japanese Unexamined Patent Publication No. 146283/1975.

However, it has not been known to prepare a thyristor wherein the leakage current of the reverse-biase PN junction in OFF state is increased in high degree under excellent reproducibility.

It has been sought to attain such process in a practical operation.

SUMMARY OF THE INVENTION

It is an object of the present invention to provide a process for preparing an improved semiconductor switch.

It is another object of the present invention to provide a novel process for preparing a heat sensitive semiconductor which switches from the OFF state to the ON state at a relatively low temperature.

It is the other object of the present invention to provide a novel process for preparing a heat sensitive semiconductor wherein a leakage current at the reverse biased PN junction in the OFF state is increased in high degree under excellent reproducibility.

The other objects of the present invention will be further understood by the description referring to the drawings.

DETAILED DESCRIPTION OF THE PREFERRED EMBODIMENTS

Figure 1:
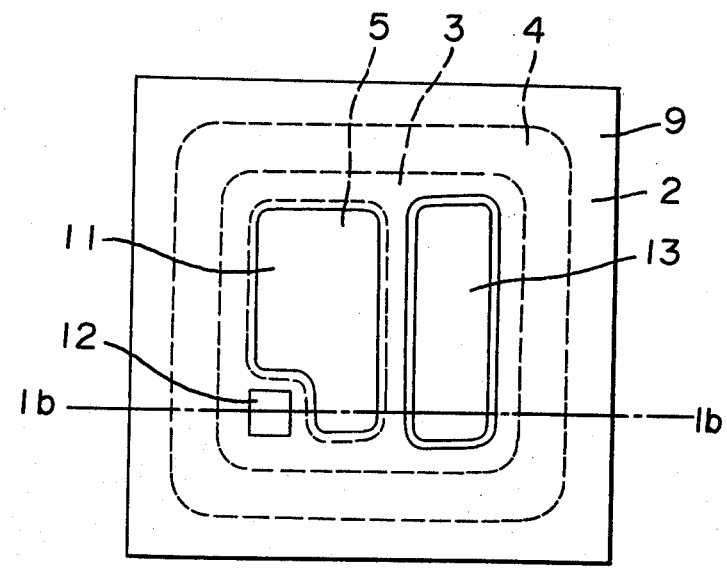
FIG. 1(a) is a plan view showing a middle step of one embodiment of the present invention.
FIG. 1(b) is a sectional view showing the middle step.
Figure 1:
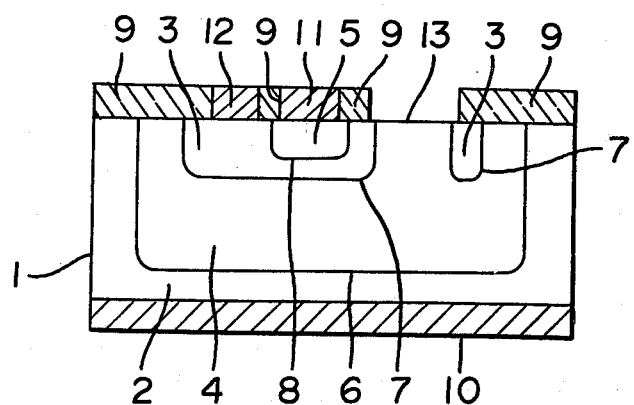

Referring to the drawings, one embodiment of the present invention will be illustrated.

FIG. 1 shows a structure of an unfinished thyristor having a PNPN four layer structure in a step of the preparation of the present invention. FIG. 1(a) is a plan view and FIG. 1(b) is a sectional view taken along a line Ib—Ib of FIG. 1(a). In FIG. 1, the reference numeral (1) designates an N type silicon substrate as the raw material; (2) designates a P type emitter region which is formed by diffusing boron etc. in the N type silicon substrate (1) by the conventional selective diffusion technique; (3) designates a P type base region which is formed by diffusing boron etc. from the front surface of the N type silicon substrate (1) by the conventional selective diffusion technique; (4) designates an N type base region as the residual part of the N type silicon substrate (1); (5) designates an N type emitter region which is formed by diffusing phosphorus in the P type base region by the conventional selective diffusion technique; (6), (7) and (8) designate PN junctions formed by these steps and respectively the first emitter junction; the collector junction and the second emitter junction; (9) designates a silicon oxide film as a protective film; (10) designates an anode made of gold coated on the P type emitter region; (11) and (12) designate a cathode and a gate which are respectively formed by a metal vaporizing deposition of aluminum etc. on the surface of the N type emitter region (5) and on the P type base region (3); (13) designates a surface exposed part of the N type base region (4) surrounded by the P type base region (3).

Figure 2:
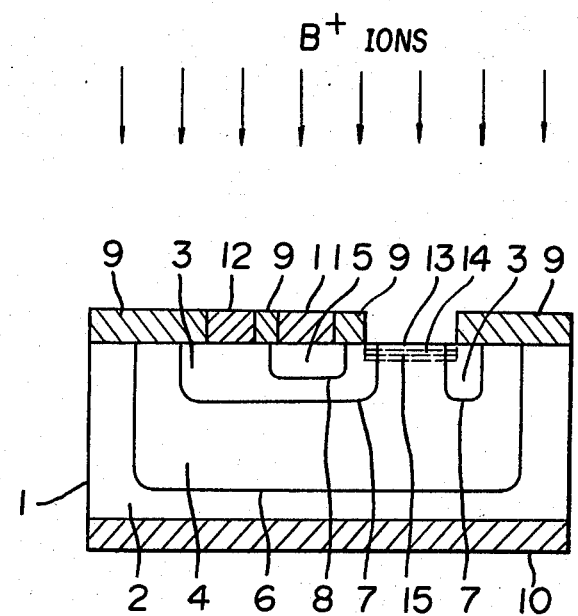
FIG. 2 is a sectional view showing a following step of the embodiment of the present invention.

FIG. 2 is a sectional view of the thyristor showing an ion implantation step following to the step shown in FIG. 1. In the ion implantation step, boron ions (B+) are implanted by the conventional ion implantation technique from the surface exposed part (13) after the heat treating steps such as diffusion and electrode formation steps. It is also possible to use other ions of an element of Group III of the periodic table such as gallium and aluminum.

The energy for implanted ions is chosen so that the projected range of implanted ions in the silicon oxide film and aluminum is far shorter than the thickness of the silicon oxide film (9) and the cathode (11) and the gate (12) made of aluminum. For example, when boron ions (B+) as implanted ions are implanted at the implantation energy of 100 KeV, the projected range of boron ions (B+) in the silicon oxide film is about 0.3 μm and the range of boron ions in the aluminum is slightly longer than that of the silicon oxide film. When the thickness of the silicon oxide membrane (9), the cathode (11) and the gate (12) are respectively greater than 1 μm, the silicon oxide film (9), the cathode (11) and the gate (12) respectively impart a masking effect to the implanted boron ions. As the result, the boron ions are implanted only below the surface exposed part (13) to form the ion-implanted region (14) as shown in FIG. 2.

In order to impart a perfect masking effect against the implanted ions and to prevent deterioration of the silicon oxide film (9), the cathode (11) and the gate (12), it is possible to provide a thick photoresist film on the parts beside the surface exposed part (13) before the ion implantation step.

As it is clear from FIG. 2, the ion implanted region (14) is substantially a part of the P type base region (3) formed by converting the N type base region (4) to the P type whereby the collector junction (7) includes the collector junction (15) which is formed by the ion implantation step.

Figure 3:
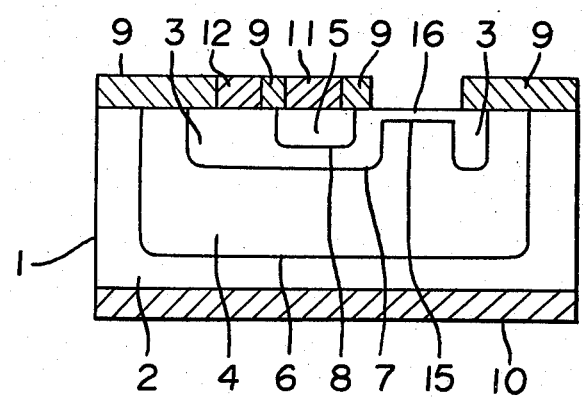
FIG. 3 is a sectional view of the heat sensitive semiconductor switch prepared by the embodiment of the present invention.

FIG. 3 is a sectional view of a PNPN four layer thyristor prepared by the process of the present invention.

In FIG. 3, the parts (1) to (15) correspond to those of the parts of FIGS. 1 and 2. The reference numeral (16) designates a region having recombination centers formed by ion implantation. The ends of the PN junction are protected by the silicon oxide film (9) whereby it can be easily assembled in a desired form with a resin mold or a can seal mold by the conventional assembling technique.

As it is clear from the embodiment of the present invention, the surface exposed part (13) surrounded by the P type base region (3) is formed in a part of the N type base region (4) and boron ions are implanted from the surface exposed part (13) to form the ion implantation region (14). The newly formed collector junction (15) has the part increasing significantly leakage current that is the region (16) having many recombination centers. Thus, the resulting thyristor can be switched from the OFF state to the ON state at remarkably low temperature.

The lattice defect formed by the ion implantation, is dependent upon the amount of the implanted ions and a higher concentration of the lattice defect is caused depending upon increase of the amount of the implanted ions. Accordingly, various heat sensitive semiconductor switches which can switch at a desired temperature can be obtained by adjusting the amount of the implanted ions. It is also possible to obtain semiconductor switches which switch at a lower temperature by increasing the area of the exposed surface (13) and increasing the area of the newly formed collector junction (15).

Moreover, in the advantageous feature of the present invention, the ion implantation step is carried out after forming the N type emitter region (5) (after the total diffusion steps) preferably after the total heat treatment step including the formation of the electrodes.

If a heat treatment is carried out after the ion implantation step, the ion-implanted region is annealed to cause to disappear the lattice defect formed by the ion implantation and it does not function as the recombination center.

In the above-mentioned embodiments of the present invention, the structure of a planar type PNPN three terminal thyristor has been illustrated. Thus, the process of the present invention can be also applied to the structures beside the planar type ones, such as mesa type ones and thyristors having three or more PN junctions such as NPNPN structure or thyristors having two terminals.

In accordance with the process of the present invention, ions of the conductive type deciding impurity are implanted from the surface exposed part of the other conductive type base region surrounded by one conductive type base region after finishing all of the heat-treatment steps whereby the collector junction having large leakage current is formed under excellent control and the switching temperature from the OFF state to the ON state caused by the thermal function of a semiconductor switch can be easily adjusted at lower level in high reproducibility. This has significant advantages.

What is claimed is:

1. A process for preparing a heat sensitive semiconductor switch which comprises a step of preparing a first conductive type silicon substrate; a step of forming a first region by diffusing a second conductive type impurity from at least one main surface of said silicon substrate; a step of forming a second region having a surface exposed part of said silicon substrate by diffusing a second conductive type impurity from the other main surface of said silicon substrate; a step of forming a third region by diffusing a first conductive type impurity in said second region; a step of coating a metal electrode at the surface exposed part in said first, second and third regions; and a step of ion implantation of a second conductive type deciding impurity in the surface exposed part of the substrate in the second region at least after forming said first second and third regions.

2. A process for preparing a heat sensitive semiconductor switch according to claim 1 wherein the ion-implanted impurity is at least one element selected from the group consisting of boron, gallium and aluminum, and wherein the silicon substrate and the third region are of N type, and the first and second regions are of P type.

3. A process for preparing a heat sensitive semiconductor switch according to claim 2 wherein the step of ion implantation is carried out after coating a metal to form electrodes.

* * * * *